United States Patent
Kil et al.

(10) Patent No.: US 10,726,883 B2
(45) Date of Patent: Jul. 28, 2020

(54) INTEGRATED CIRCUIT DEVICES HAVING STROBE SIGNAL TRANSMITTERS WITH ENHANCED DRIVE CHARACTERISTICS

(71) Applicant: Samsung Electronics Co., Ltd., Suwon-si, Gyeonggi-do (KR)

(72) Inventors: Beom-Yong Kil, Seoul (KR); Yang-Ki Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/040,702

(22) Filed: Jul. 20, 2018

(65) Prior Publication Data
US 2019/0237112 A1    Aug. 1, 2019

(30) Foreign Application Priority Data

Jan. 31, 2018 (KR) .................. 10-2018-0012051
Mar. 20, 2018 (KR) .................. 10-2018-0032341

(51) Int. Cl.
| | |
|---|---|
| *G11C 7/04* | (2006.01) |
| *G11C 7/22* | (2006.01) |
| *G11C 5/04* | (2006.01) |
| *G11C 7/10* | (2006.01) |

(52) U.S. Cl.
CPC .............. *G11C 7/04* (2013.01); *G11C 5/04* (2013.01); *G11C 7/1066* (2013.01); *G11C 7/22* (2013.01); *G11C 7/222* (2013.01)

(58) Field of Classification Search
CPC ........... G11C 7/04; G11C 5/04; G11C 7/1066; G11C 7/22; G11C 7/222
See application file for complete search history.

(56) References Cited

U.S. PATENT DOCUMENTS

| | | | |
|---|---|---|---|
| 7,009,905 B2 | 3/2006 | Aipperspach et al. | |
| 7,262,637 B2 * | 8/2007 | Pan ...................... | H03K 17/145 326/29 |
| 7,804,734 B2 * | 9/2010 | Koo .................... | G06F 13/4239 365/193 |
| 8,330,534 B2 | 12/2012 | Zhai et al. | |
| 8,699,285 B2 * | 4/2014 | Park ..................... | G11C 7/1051 365/193 |

(Continued)

FOREIGN PATENT DOCUMENTS

| | | |
|---|---|---|
| KR | 10-0406579 | 11/2003 |
| KR | 1020170109168 | 9/2017 |

*Primary Examiner* — Tri M Hoang
(74) *Attorney, Agent, or Firm* — Myers Bigel, P.A.

(57) ABSTRACT

An integrated circuit device includes a read strobe signal transmitter including a main output drive circuit and a victim output drive circuit having an output terminal electrically coupled to an output terminal of the main output drive circuit. The read strobe signal transmitter is configured to: (i) generate a periodic active read strobe signal during a read time interval, in response to a pair of periodic drive signals, which are 180° out-of-phase relative to each other during the read time interval, and (ii) generate a disabled read strobe signal at a fixed logic level during a non-read time interval, in response to an active victim control signal. The main output drive circuit is responsive to the pair of periodic drive signals during the read time interval, and the victim output drive circuit is responsive to the active victim control signal during the non-read time interval.

18 Claims, 10 Drawing Sheets

(56) References Cited

U.S. PATENT DOCUMENTS

| | | | |
|---|---|---|---|
| 8,824,227 B2* | 9/2014 | Kim | G11C 29/28 |
| | | | 365/189.07 |
| 9,030,233 B2* | 5/2015 | Dono | G11C 7/106 |
| | | | 326/83 |
| 9,257,995 B2 | 2/2016 | Van De Graaff | |
| 2003/0048114 A1 | 3/2003 | Kondoh et al. | |
| 2003/0184343 A1 | 10/2003 | Kuge | |
| 2010/0102872 A1 | 4/2010 | Wu et al. | |
| 2017/0272076 A1 | 9/2017 | Lim | |
| 2018/0196713 A1* | 7/2018 | Lee | G06F 11/1068 |

* cited by examiner

PRIOR ART

FIG. 4

PRIOR ART

INTEGRATED CIRCUIT DEVICES HAVING STROBE SIGNAL TRANSMITTERS WITH ENHANCED DRIVE CHARACTERISTICS

REFERENCE TO PRIORITY APPLICATION

This application claims the benefit of Korean Patent Application Nos. 10-2018-0012051, filed Jan. 31, 2018, and 10-2018-0032341, filed Mar. 20, 2018, the disclosures of which are hereby incorporated herein in their entirety by reference.

BACKGROUND

The inventive concept relates to a semiconductor device, and more particularly, to a transmitter preventing deterioration of an output drive circuit by reducing influences of negative biased temperature instability (NBTI) and positive biased temperature instability (PBTI) and to a semiconductor device including the same.

Due to the development of semiconductor manufacturing technology, various circuit devices, such as metal-oxide-semiconductor (MOS) transistors, are formed in semiconductor devices or integrated circuits (ICs). ICs are used for customer electronics and are required to exhibit optimum operation performance in various application uses. ICs need to satisfy reliability requirements for ensuring operation performance for a certain time period.

Due to NBTI and PBTI reliability requirements, threshold voltages ($V_{th}$) of transistors may shift during operation. Shifts in threshold voltages of transistors can cause significant performance deterioration and voltage sensitivity.

SUMMARY

The inventive concept provides an output drive circuit and a transmitter, which reduce influences of negative biased temperature instability (NBTI) and positive biased temperature instability (PBTI), and also provides a semiconductor device including the output drive circuit and the transmitter.

According to an aspect of the inventive concept, there is provided a semiconductor device including a transmitter transmitting a read strobe signal synchronized with data. The transmitter includes: a main output drive circuit outputting the read strobe signal toggled to falling and rising edges thereof, during a read operation in which the data is output; and a victim output drive circuit outputting the read strobe signal having logic high during a non-read operation.

According to another aspect of the inventive concept, there is provided a semiconductor device including a transmitter transmitting a read strobe signal synchronized with data. The transmitter includes: (i) a main output drive circuit outputting the read strobe signal toggled to rising and falling edges thereof, during a read operation in which the data is output; and (ii) a victim output drive circuit outputting the read strobe signal having logic low during a non-read operation.

According to yet another aspect of the inventive concept, there is provided a semiconductor device including: a first transmitter transmitting a read strobe signal synchronized with data; and a second transmitter transmitting a complementary read strobe signal synchronized with the data and complementary to the read strobe signal. The first transmitter includes: a first main output drive circuit outputting the read strobe signal toggled to rising and falling edges thereof, during a read operation in which the data is output; and a first victim output drive circuit outputting the read strobe signal having logic low during a non-read operation. The second transmitter includes: a second main output drive circuit outputting the complementary read strobe signal toggled to rising and falling edges thereof, during the read operation; and a second victim output drive circuit outputting the complementary read strobe signal having logic high during the non-read operation.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
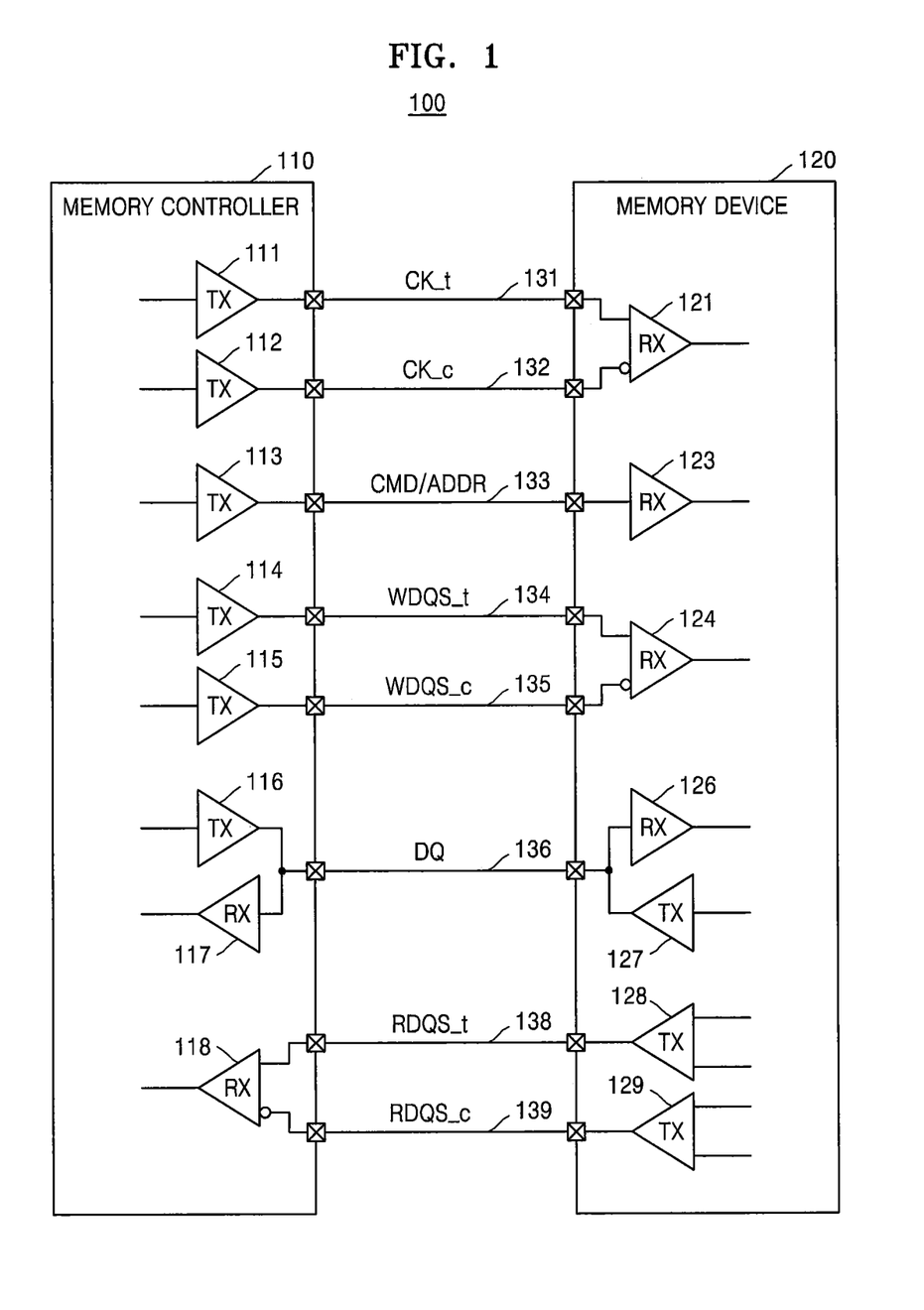
FIG. 1 is a block diagram schematically illustrating a memory system as an example of a semiconductor device according to the inventive concept.

FIG. 1 is a block diagram schematically illustrating a memory system as an example of a semiconductor device according to the inventive concept. Referring to FIG. 1, a memory system 100 may include a memory controller 110 and a memory device 120. The memory system 100 may be included in a personal computer (PC) or a mobile electronic device. The mobile electronic device may be implemented with a laptop computer, a mobile phone, a smart phone, a tablet PC, a personal digital assistant (PDA), an enterprise digital assistant (EDA), a digital still camera, a digital video camera, a portable multimedia player (PMP), a personal or portable navigation device (PND), a handheld game console, a mobile Internet device (MID), a wearable computer, an Internet-of-Things (IoT) device, an Internet-of-Everything (IoE) device, or a drone, for example.

The memory controller 110 may be implemented with a system-on-chip (SoC), an application processor (AP), a mobile AP, a chipset, or a set of chips. The memory controller 110 may include random access memory (RAM), a central processing unit (CPU), a graphics processing unit (GPU), and/or a modem. In some embodiments, the memory controller 110 may function as a modem and an AP.

The memory device 120 may be implemented with a volatile memory device(s). The volatile memory device may be implemented with RAM, dynamic RAM (DRAM), or static RAM (SRAM), without being limited thereto. For example, the memory device 120 may be implemented with wide input/output (I/O) DRAM, low power double data rate (LPDDR) DRAM, or the like.

The volatile memory device loses stored data when not powered. In contrast, a non-volatile memory device such as magnetic RAM (MRAM) may maintain stored data even after powered down. Therefore, when a loss of data due to power failures or power down is not desired, the non-volatile memory device may be preferably used. In particular, when memory includes spin transfer torque (STT)-MRAM, the memory may have a merit of non-volatility of MRAM in addition to a merit of fast response time of DRAM. An STT-MRAM cell may include a magnetic tunnel junction (MJT) device and a select transistor. The MJT device may basically include two magnetic layers (a fixed layer and a free layer) and a tunnel layer between the magnetic layers. A magnetization direction of the fixed layer is fixed, and a magnetization direction of the free layer may be identical to or reverse to that of the fixed layer depending upon conditions.

According to an embodiment, the memory device 120 may be implemented with an electrically erasable programmable read-only memory (EEPROM), flash memory, MRAM, STT-MRAM, ferroelectric RAM (FeRAM), phase change RAM (PRAM), resistive RAM (RRAM), nanotube RRAM, polymer RAM (PoRAM), nano-floating gate memory (NFGM), holographic memory, a molecular electronics memory device, insulator resistance change memory, or the like.

The memory controller 110 may control the memory device 120 such that data stored in the memory device 120 can be read in response to a read request and data can be written to the memory device 120 in response to a write request. The memory controller 110 may control a write or read operation for the memory device 120 by providing a command CMD and an address ADDR to the memory device 120. In addition, data DQ that is input in a write operation and data DQ that is output in a read operation may be transmitted and received between the memory controller 110 and the memory device 120.

The memory controller 110 may include transmitters 111 and 112 for transmitting a pair of clock signals CK_t and CK_c, which control timing of data input/output of the memory device 120. The pair of clock signals CK_t and CK_c may be respectively configured as differential signals having complementary phases to each other. The pair of clock signals CK_t and CK_c are typically clocks having frequencies related to transmission rates of the command CMD and the address ADDR applied to perform data input/output operations of the memory device 120.

The memory controller 110 may include a transmitter 113 for transmitting the command CMD and/or the address ADDR, and the command CMD and/or the address ADDR may be applied to the memory device 120 via a signal line 133. The memory controller 110 may include transmitters 114 and 115 for transmitting a pair of write strobe signals WDQS_t and WDQS_c, and the pair of write strobe signals WDQS_t and WDQS_c may be applied to the memory device 120 via signal lines 134 and 135. The pair of write strobe signals WDQS_t and WDQS_c may be configured as differential signals having complementary phases to each other. The pair of write strobe signals WDQS_t and WDQS_c are typically unidirectional write strobes related to the data DQ that is to be written to the memory device 120 to perform a write operation of the memory device 120.

The memory controller 110 may further include a transmitter 116 for transmitting the data DQ to be written to the memory device 120 and a receiver 117 for receiving the data DQ read from the memory device 120. During a write operation, the data DQ to be written to the memory device 120 may be applied to the memory device 120 via the transmitter 116 and a signal line 136. Alternatively, during a read operation, the data DQ read from the memory device 120 may be received by the memory controller 110 via the signal line 136 and the receiver 117. To simplify the diagram, although transmission and reception of one piece of data DQ via one signal line 136 are described in the present embodiment, a plurality of pieces of data DQs may be transmitted and received via a plurality of signal lines. For example, 8, 16, 32, 64, 96, or 128 pieces of data DQs may be transmitted and received via a plurality of signal lines 136.

The memory controller 110 may also include a receiver 118, as shown, which is configured to receive a pair of read strobe signals RDQS_t and RDQS_c. This pair of read strobe signals RDQS_t and RDQS_c may be output from the memory device 120 and received by the memory controller 110 via signal lines 138 and 139. The pair of read strobe signals RDQS_t and RDQS_c may be configured as differential signals having complementary phases to each other. The pair of read strobe signals RDQS_t and RDQS_c are unidirectional read strobes related to the data DQ that is read from the memory device 120 during a read operation.

The memory device 120 may include a receiver 121 receiving the pair of clock signals CK_t and CK_c that are transmitted by the memory controller 110 via signal lines 131 and 132. The memory device 120 may include a receiver 123 receiving the command CMD and/or the address ADDR that are transmitted by the memory controller 110 via the signal line 133. The memory device 120 may latch the command CMD and/or the address ADDR on rising and falling edges of a clock signal CK_t and a complementary clock signal CK_c.

The memory device 120 may include a receiver 124 receiving the pair of write strobe signals WDQS_t and WDQS_c that are transmitted by the memory controller 110 via the signal lines 134 and 135. The memory device 120 may include a receiver 126 receiving write data DQ that is transmitted by the memory controller 110 via the signal line 136. The memory device 120 may latch the write data DQ on rising and falling edges of a write strobe signal WDQS_t and a complementary write strobe signal WDQS_c.

The memory device 120 may include a transmitter 127 transmitting the data DQ read according to the read operation of the memory device 120 to the memory controller 110 via the signal line 136. The memory device 120 may include transmitters 128 and 129 transmitting the pair of read strobe signals RDQS_t and RDQS_c, and the pair of read strobe signals RDQS_t and RDQS_c may be transmitted to the memory controller 110 via the signal lines 138 and 139. The read data DQ may be transmitted on rising and falling edges of a read strobe signal RDQS_t and a complementary read strobe signal RDQS_c.

Figure 2:
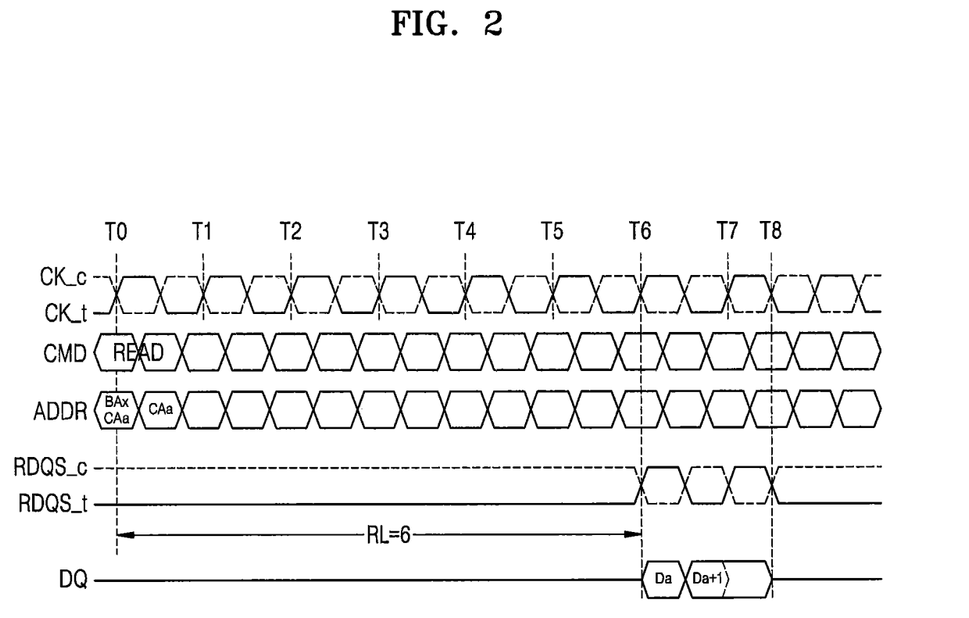
FIG. 2 is a timing diagram illustrating a read operation performed by the memory device of FIG. 1.

FIG. 2 is a timing diagram illustrating a read operation performed by the memory device 120 of FIG. 1. Referring to FIGS. 1-2, the clock signal CK_t and the complementary clock signal CK_c may be received by the memory device 120. From a time point T0, the clock signal CK_t and the complementary clock signal CK_c are received. At the time point T0, a read command READ, a bank address BAx, and a column address CAa, which are synchronized with a rising edge of the clock signal CK_t, may be received by the memory device 120.

Before performing a corresponding read operation, the memory device 120 may perform an activate operation first. Before the read command READ at time point T0 is received, a row activate command ACTIVATE (or row active command ACT), the bank address BAx, and a row address RA may be received by the memory device 120. In the activate operation, the memory device 120 may select a bank corresponding to the bank address BAx and may open or activate a row or a word line corresponding to the row address RA in the selected bank. Next, during read operation at time point T0, the memory device 120 may read data of memory cells corresponding to the column address CAa among memory cells connected to the opened row in the selected bank according to the bank address BAx and the column address CAa, which are applied together with the read command READ.

After the read command READ at the time point T0 is applied, at a time point T6 when a set read latency RL is elapsed, the memory device 120 may output the read data DQ according to the read operation. For example, it is assumed that the memory device 120 is set to be operated under conditions of the read latency RL=6 and a burst length BL=2. The read data DQ may be output as 2-bit data ($D_a$, $D_{a+1}$) corresponding to the condition of the burst length BL=2. The 2-bit data ($D_a$, $D_{a+1}$) may be output in synchronization with rising and falling edges of the pair of read strobe signals RDQS_t and RDQS_c. The pair of read strobe signals RDQS_t and RDQS_c may be output together with the read data DQ.

According to an embodiment, the pair of read strobe signals RDQS_t and RDQS_c may be clocked at a time point T5 that is earlier by 1 clock cycle of the pair of clock signals CK_t and CK_c than the time point T6 when the read data DQ is output. This may be an advantageous design condition for satisfying a timing parameter, for example, tDQSCK, between an edge of the pair of clock signals CK_t and CK_c and an edge of the pair of read strobe signals RDQS_t and RDQS_c.

During the read operation of the memory device 120, the pair of read strobe signals RDQS_t and RDQS_c may be toggled to rising and falling edges thereof from the time point T6 to a time point T8 based on the read data DQ. In the remaining periods other than the period from the time point T6 to the time point T8, that is, in periods from the time point T0 to the time point T6 and after the time point T8, it can be seen that the read strobe signal RDQS_t is in a logic low state, and that the complementary read strobe signal RDQS_c is in a logic high state.

Figure 3:
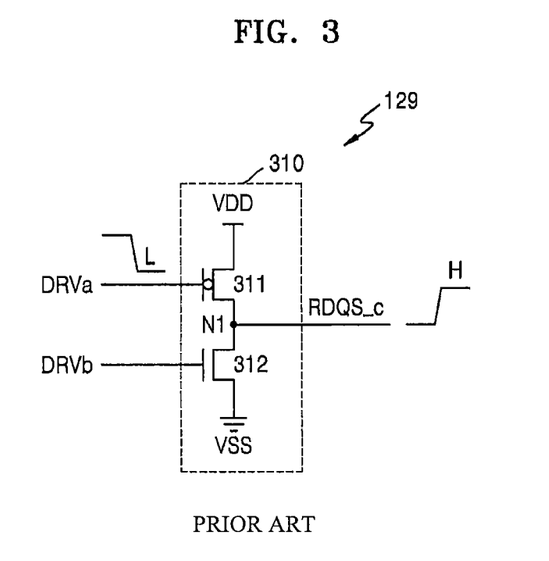
FIG. 3 is a circuit diagram illustrating a transmitter transmitting a complementary read strobe signal in FIG. 1, according to the related art.

FIG. 3 is a circuit diagram illustrating a transmitter 129 transmitting the complementary read strobe signal RDQS_c in FIG. 1, according to the related art.

Referring to FIG. 3, the transmitter 129 may include an output drive circuit 310 transmitting the complementary read strobe signal RDQS_c in response to first and second drive signals DRVa and DRVb. The output drive circuit 310 may include a p-type metal-oxide-semiconductor (PMOS) transistor 311 and an n-type MOS (NMOS) transistor 312, which are connected in series between a power supply voltage VDD and a ground voltage VSS. The first drive signal DRVa may be connected to a gate of the PMOS transistor 311, and the second drive signal DRVb may be connected to a gate of the NMOS transistor 312. A drain of the PMOS transistor 311 may be connected to a drain of the NMOS transistor 312, and the complementary read strobe signal RDQS_c may be output from a connection node N1.

The first and second drive signals DRVa and DRVb are signals generated on a data output path according to the read operation of the memory device 120 due to correlations with the read data DQ. As shown from the time point T6 to the time point T8 in FIG. 2, the output drive circuit 310 may output the complementary read strobe signal RDQS_c toggled to falling and rising edges thereof in response to the first and second drive signals DRVa and DRVb. The complementary read strobe signal RDQS_c, together with the read strobe signal RDQS_t, are used to transmit the read data DQ to the memory controller 110 (FIG. 1).

As shown in the periods from the time point T0 to the time point T6 and after the time point T8 in FIG. 2, the output drive circuit 310 may output the complementary read strobe signal RDQS_c in the logic high state in a period in which the read data DQ is not output. Here, in the output drive circuit 310, the PMOS transistor 311 is turned on in response to the first drive signal DRVa having logic low.

When the PMOS transistor 311 is turned on, hydrogen ions coming from broken silicon-hydrogen (Si—H) bonds between a silicon (Si) substrate and a gate oxide film ($SiO_2$) due to an increase in an operation temperature may generate interface traps having positive (+) charges at an interface between the silicon substrate and the gate oxide film. Thus, a negative biased temperature instability (NBTI) phenomenon may occur, and a threshold voltage ($V_{th}$) of the PMOS transistor 311 may be increased. Such a shift of the threshold voltage may increase with increasing temperature and thus worsen the NBTI phenomenon.

Figure 4:
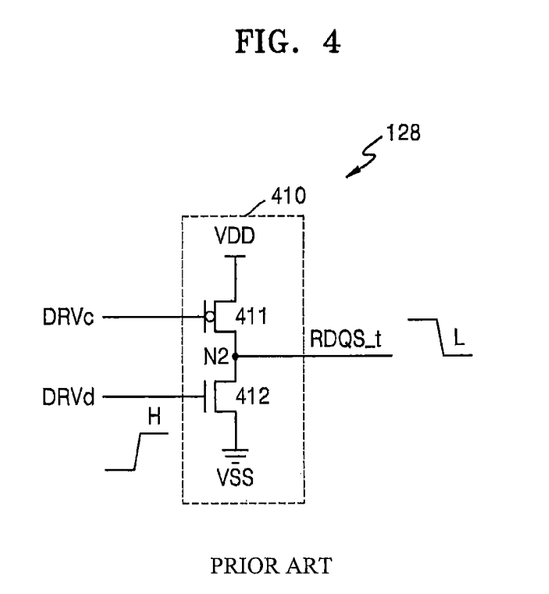
FIG. 4 is a circuit diagram illustrating a transmitter transmitting a read strobe signal in FIG. 1, according to the related art.

FIG. 4 is a circuit diagram illustrating the transmitter 128 transmitting the read strobe signal RDQS_t in FIG. 1, according to the related art.

Referring to FIG. 4, the transmitter 128 may include an output drive circuit 410 outputting the read strobe signal RDQS_t in response to third and fourth drive signals DRVc and DRVd. The output drive circuit 410 may include a PMOS transistor 411 and an NMOS transistor 412, which are connected in series between the power supply voltage VDD and the ground voltage VSS. The third drive signal DRVc may be connected to a gate of the PMOS transistor 411, and the fourth drive signal DRVd may be connected to a gate of the NMOS transistor 412. A drain of the PMOS transistor 411 may be connected to a drain of the NMOS transistor 412, and the read strobe signal RDQS_t may be output from a connection node N2.

The third and fourth drive signals DRVc and DRVd are signals generated on the data output path according to the read operation of the memory device 120 due to correlations with the read data DQ. As shown from the time point T6 to the time point T8 in FIG. 2, the output drive circuit 410 may output the read strobe signal RDQS_t toggled to rising and falling edges thereof in response to the third and fourth drive signals DRVc and DRVd. The read strobe signal RDQS_t, together with the complementary read strobe signal RDQS_c, are used to transmit the read data DQ to the memory controller 110.

As shown in the periods from the time point T0 to the time point T6 and after the time point T8 in FIG. 2, the output drive circuit 410 may, output the read strobe signal RDQS_t in the logic low state in the period in which the read data DQ is not output. Here, in the output drive circuit 410, the NMOS transistor 412 is turned on in response to the fourth drive signal DRVd having logic high.

When the NMOS transistor 412 is turned on, interface traps having negative (−) charges may be generated at an interface between the silicon substrate and the gate oxide film due to an increase in an operation temperature and thus may cause a positive biased temperature instability (PBTI) phenomenon in which a threshold voltage ($V_{th}$) of the NMOS transistor 412 is increased.

Figure 5:
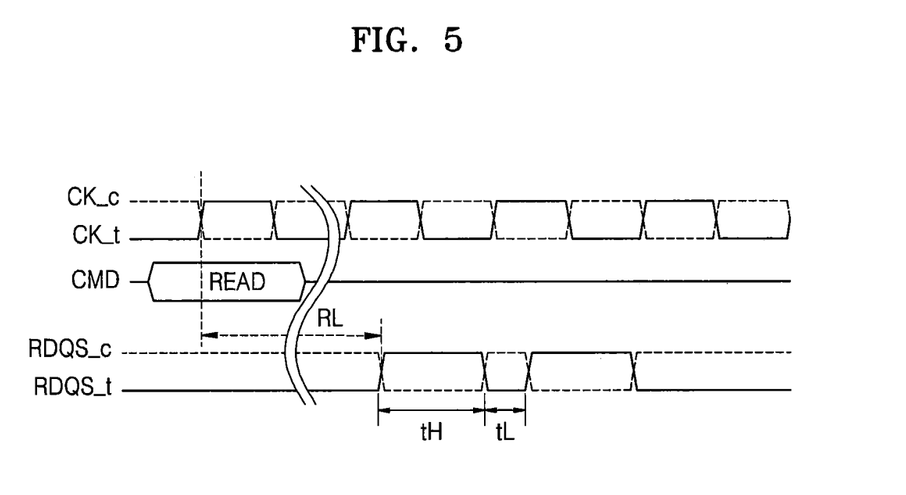
FIG. 5 is a timing diagram illustrating a pair of read strobe signals according to operations of the transmitters of FIGS. 3 and 4.

In FIGS. 3 and 4, the threshold voltages ($V_{th}$) of the PMOS transistor 311 of the output drive circuit 310 and the NMOS transistor 412 of the output drive circuit 410 may be increased due to the NBTI and/or PBTI phenomena. Thus, as shown in FIG. 5, there is an issue of a duty ratio distortion phenomenon in which a duty ratio between a logic high period tH and a logic low period tL of the pair of read strobe signals RDQS_t and RDQS_c is distorted. According to embodiments of the inventive concept, to reduce deterioration such as duty ratio distortion due to the NBTI and/or PBTI phenomena, a transmitter including a main output drive circuit and a victim output drive circuit together is proposed.

Figure 6:
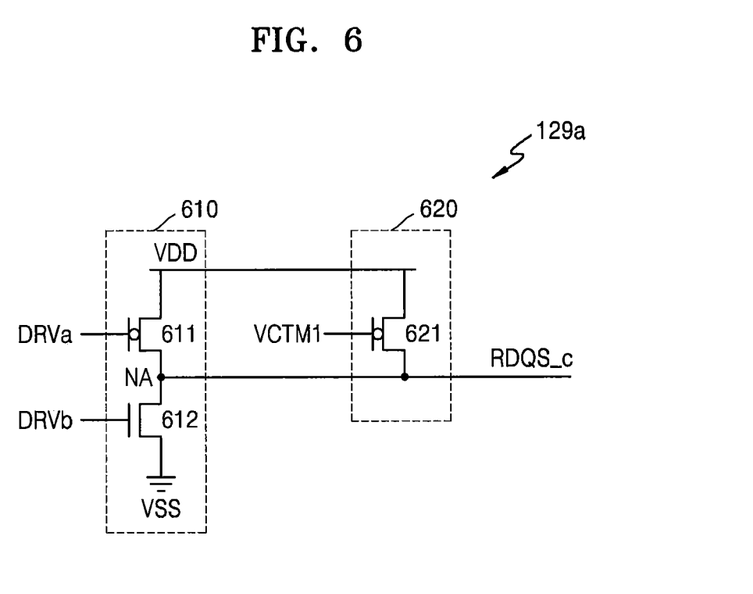
FIGS. 6 and 7 are diagrams illustrating a transmitter according to an embodiment of the inventive concept.
Figure 7:
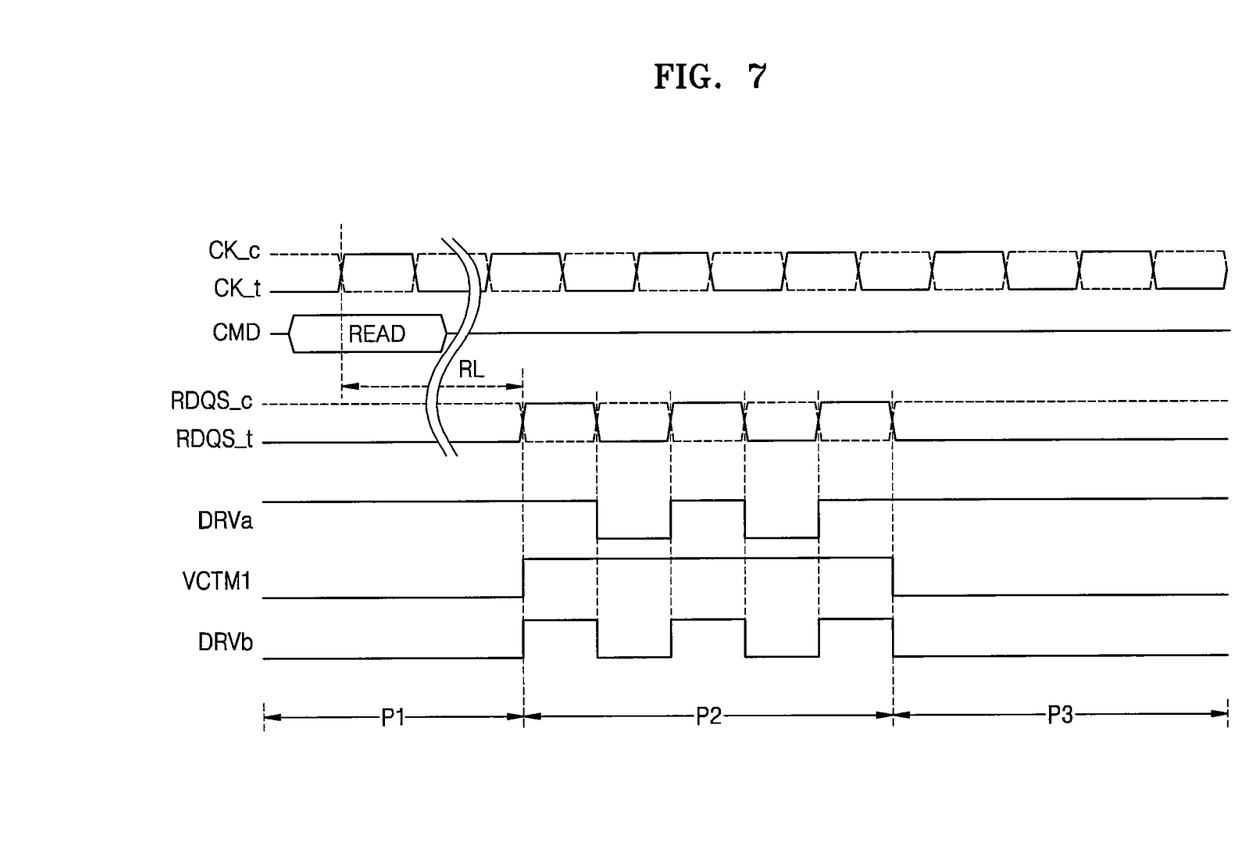

FIGS. 6 and 7 are diagrams illustrating a transmitter according to an embodiment of the inventive concept. FIG. 6 is a circuit diagram of a transmitter 129a, and FIG. 7 is an operation timing diagram of the transmitter 129a. Referring to FIG. 6, the transmitter 129a includes a main output drive circuit 610 and a victim output drive circuit 620. The main output drive circuit 610, identically to the output drive circuit 310 of FIG. 3, may include a PMOS transistor 611 and an NMOS transistor 612, which are connected in series between the power supply voltage VDD and the ground voltage VSS. The PMOS transistor 611 may be referred to as a first pull-up driver, and the NMOS transistor 612 may be referred to as a pull-down driver.

The first drive signal DRVa may be connected to a gate of the PMOS transistor 611, and the second drive signal DRVb may be connected to a gate of the NMOS transistor 612. The first and second drive signals DRVa and DRVb are signals generated on the data output path according to the read operation of the memory device 120 (FIG. 1) due to correlations with the read data DQ. A drain of the PMOS transistor 611 may be connected to a drain of the NMOS transistor 612, and the complementary read strobe signal RDQS_c may be output from a connection node NA.

As shown in FIG. 7, the main output drive circuit 610 may be enabled in a period P2 in which the read data DQ of the memory device 120 is output and may output the complementary read strobe signal RDQS_c toggled to rising and falling edges thereof in response to the first and second drive signals DRVa and DRVb. Here, the first and second drive signals DRVa and DRVb are provided to be toggled to logic high and logic low, whereby the PMOS transistor 611 and the NMOS transistor 612 may be selectively turned on or off.

As shown in FIG. 7, the main output drive circuit 610 may be disabled in response to the first and second drive signals DRVa and DRVb, in periods P1 and P3 in which the read data DQ of the memory device 120 is not output. Here, the first drive signal DRVa having logic high may be provided, and the second drive signal DRVb having logic low may be provided, whereby the PMOS transistor 611 and the NMOS transistor 612 may be turned off.

The victim output drive circuit 620 may include a PMOS transistor 621 connected between the power supply voltage VDD and the connection node NA. The PMOS transistor 621 may be referred to as a second pull-up driver. A first control signal VCTM1 may be connected to a gate of the PMOS transistor 621.

As shown in FIG. 7, the victim output drive circuit 620 may be disabled in response to the first control signal VCTM1, in the period P2 in which the main output drive circuit 610 is enabled and outputs the complementary read strobe signal RDQS_c. Here, the first control signal VCTM1 having logic high may be provided, whereby the PMOS transistor 621 may be turned off.

As shown in FIG. 7, the victim output drive circuit 620 may be enabled in response to the first control signal VCTM1, in the periods P1 and P3 in which the main output drive circuit 610 is disabled. Here, the first control signal VCTM1 having logic low may be provided, whereby the PMOS transistor 621 may be turned on.

In the present embodiment, in the periods P1 and P3 in which the read data DQ of the memory device 120 is not output, the PMOS transistor 611 of the main output drive circuit 610 is turned off, and the PMOS transistor 621 of the victim output drive circuit 620 is turned on, whereby the complementary read strobe signal RDQS_c having logic high is output. Thus, the NBTI phenomenon may be prevented in the turned-off PMOS transistor 611 of the main output drive circuit 610.

Figure 8:
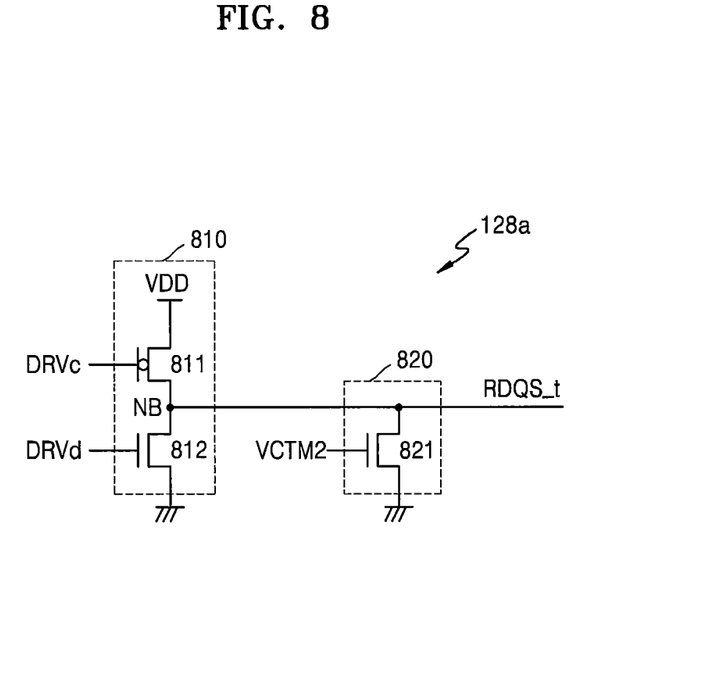
FIGS. 8 and 9 are diagrams illustrating a transmitter according to an embodiment of the inventive concept.
Figure 9:
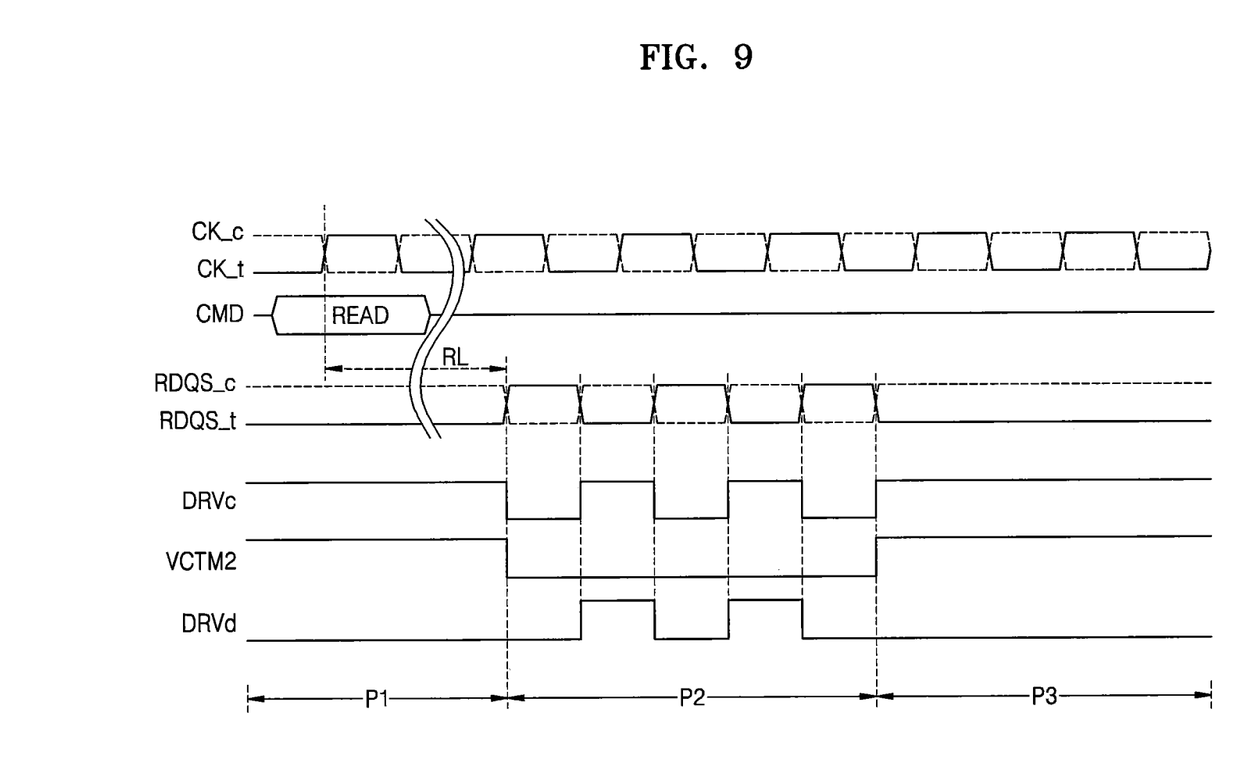

FIGS. 8 and 9 are diagrams illustrating a transmitter according to an embodiment of the inventive concept. FIG. 8 is a circuit diagram of a transmitter 128a, and FIG. 9 is an operation timing diagram of the transmitter 128a. Referring to FIG. 8, the transmitter 128a includes a main output drive circuit 810 and a victim output drive circuit 820. The main output drive circuit 810, identically to the output drive circuit 410 of FIG. 4, may include a PMOS transistor 811 and an NMOS transistor 812, which are connected in series between the power supply voltage VDD and the ground voltage VSS. The PMOS transistor 811 may be referred to as a pull-up driver, and the NMOS transistor 812 may be referred to as a first pull-down driver.

The third drive signal DRVc may be connected to a gate of the PMOS transistor 811, and the fourth drive signal DRVd may be connected to a gate of the NMOS transistor 812. The third and fourth drive signals DRVc and DRVd are signals generated on the data output path according to the read operation of the memory device 120 (FIG. 1) due to correlations with the read data DQ. A drain of the PMOS transistor 811 may be connected to a drain of the NMOS transistor 812, and the read strobe signal RDQS_t may be output from a connection node NB.

The third and fourth drive signals DRVc and DRVd may also be associated with the first and second drive signals DRVa and DRVb of FIGS. 6 and 7. For example, in the period P2 in which the read strobe signal RDQS_t is output, logic levels of the third and fourth drive signals DRVc and DRVd may be opposite to those of the first and second drive signals DRVa and DRVb.

As shown in FIG. 9, the main output drive circuit 810 may be enabled in the period P2 in which the read data DQ of the memory device 120 (FIG. 1) is output and may output the read strobe signal RDQS_t toggled to rising and falling edges thereof in response to the third and fourth drive signals DRVc and DRVd. Here, the third and fourth drive signals DRVc and DRVd are provided to be toggled to logic high and logic low, whereby the PMOS transistor 811 and the NMOS transistor 812 may be selectively turned on or off.

As shown in FIG. 9, the main output drive circuit 810 may be disabled in response to the third and fourth drive signals DRVc and DRVd, in the periods P1 and P3 in which the read data DQ of the memory device 120 is not output. Here, the third drive signal DRVc having logic high may be provided, and the fourth drive signal DRVd having logic low may be provided, whereby the PMOS transistor 811 and the NMOS transistor 812 may be turned off.

The victim output drive circuit 820 may include an NMOS transistor 821 connected to the connection node NB and the ground voltage VSS. The NMOS transistor 821 may be referred to as a second pull-down driver. A second control signal VCTM2 may be connected to a gate of the NMOS transistor 821.

As shown in FIG. 9, the victim output drive circuit 820 may be disabled in response to the second control signal VCTM2, in the period P2 in which the main output drive circuit 810 is enabled and outputs the read strobe signal RDQS_t. Here, the second control signal VCTM2 having logic low may be provided, whereby the NMOS transistor 821 may be turned off.

As shown in FIG. 9, the victim output drive circuit 820 may be enabled in response to the second control signal VCTM2, in the periods P1 and P3 in which the main output drive circuit 810 is disabled. Here, the second control signal VCTM2 having logic high may be provided, whereby the NMOS transistor 821 may be turned on.

In the present embodiment, in the periods P1 and P3 in which the read data DQ of the memory device 120 is not output, the NMOS transistor 812 of the main output drive circuit 810 is turned off, and the NMOS transistor 821 of the victim output drive circuit 820 is turned on, whereby the read strobe signal RDQS_t having logic low is output. Thus, the PBTI phenomenon may be prevented in the turned-off NMOS transistor 812 of the main output drive circuit 810.

As described above, in the transmitter 129a of FIG. 6, when the read data DQ is not output, the PMOS transistor 621 of the victim output drive circuit 620 is operated instead of the PMOS transistor 611 of the main output drive circuit 610, whereby the complementary read strobe signal RDQS_c having logic high may be output. In the transmitter 128a of FIG. 8, the NMOS transistor 821 of the victim output drive circuit 820 is operated instead of the NMOS transistor 812 of the main output drive circuit 810, whereby the read strobe signal RDQS_t having logic low may be output. Thus, the PMOS and NMOS transistors 611 and 812 of the main output drive circuits 610 and 810 have stable threshold voltages ($V_{th}$) without influences of NBTI and PBTI, whereby the pair of read strobe signals RDQS_t and RDQS_c may be output in a stable duty ratio, as shown in FIGS. 7 and 9.

Thus, as illustrated by FIGS. 6-7 and 8-9, an integrated circuit memory device 120 may include a read strobe signal transmitter 128, 129 may include a main output drive circuit 610, 810 and a victim output drive circuit 620, 820 having an output terminal electrically coupled to an output terminal of the main output drive circuit 610, 810. The read strobe signal transmitter 128, 129 is configured to generate a periodic active read strobe signal RDQS_c, RDQS_t during a read time interval P2, in response to a pair of periodic drive signals (DRVa, DRVb), (DRVc, DRVd), which are 180° out-of-phase relative to each other during the read time interval P2. The read strobe signal transmitter 128, 129 is also configured to generate a disabled read strobe signal (RDQS_c=1, RDQS_t=0) at a fixed logic level during a non-read time interval (P1, P3), in response to an active victim control signal (VCTM1, VCTM2).

The main output drive circuit 610, 810 is responsive to the pair of periodic drive signals (DRVa, DRVb), (DRVc, DRVd) during the read time interval P2 and the victim output drive circuit 620, 820 is responsive to the active victim control signal (VCTM1, VCTM2) during the non-read time interval (P1, P3). As shown by FIGS. 6 and 8, the victim output drive circuit 620, 820 includes a MOS transistor (621, 821) having a gate terminal responsive to the active victim control signal during the non-read time interval. In addition, the main output drive circuit includes a PMOS pull-up transistor 611, 811 having a gate terminal responsive to a first one of the pair of periodic drive signals (DRVa, DRVc) and an NMOS pull-down transistor 612, 812 having a gate terminal responsive to a second one of the pair of periodic drive signals (DRVb, DRVd).

Figure 10:
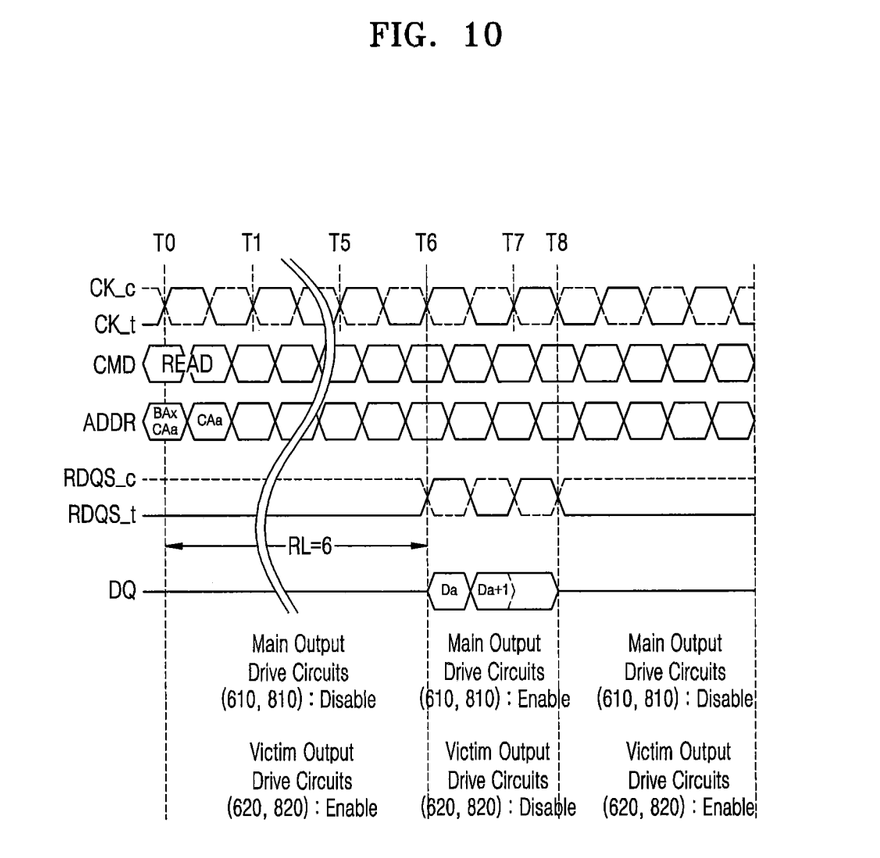
FIG. 10 is a timing diagram illustrating a read operation performed by a memory device including transmitters according to embodiments of the inventive concept.

FIG. 10 is a timing diagram illustrating a read operation performed by a memory device including transmitters according to embodiments of the inventive concept. Referring to FIG. 10, as in the timing diagram of the read operation of the memory device 120 (FIG. 1) described with reference to FIG. 2, it may be seen that, from the time point T6 to the time point T8, the pair of read strobe signals RDQS_t and RDQS_c are toggled to rising and falling edges thereof based on the read data DQ, and it may also be seen that, in the remaining periods, that is, in the periods from the time point T0 to the time point T6 and after the time point T8, the read strobe signal RDQS_t is in the logic low state, and that the complementary read strobe signal RDQS_c is in the logic high state.

In the period from the time point T6 to the time point T8, that is, when the pair of read strobe signals RDQS_t and RDQS_c are toggled, the main output drive circuit 610 of the transmitter 129a of FIG. 6 and the main output drive circuit 810 of the transmitter 128a of FIG. 8 are enabled. Here, the victim output drive circuit 620 of the transmitter 129a of FIG. 6 and the victim output drive circuit 820 of the transmitter 128a of FIG. 8 are disabled.

In the periods from the time point T0 to the time point T6 and after the time point T8, that is, when the read strobe signal RDQS_t is in the logic low state and the complementary read strobe signal RDQS_c is in the logic high state, the victim output drive circuit 620 of the transmitter 129a of FIG. 6 and the victim output drive circuit 820 of the transmitter 128a of FIG. 8 are enabled. Here, the main output drive circuit 610 of the transmitter 129a of FIG. 6 and the main output drive circuit 810 of the transmitter 128a of FIG. 8 are disabled.

Figure 11:
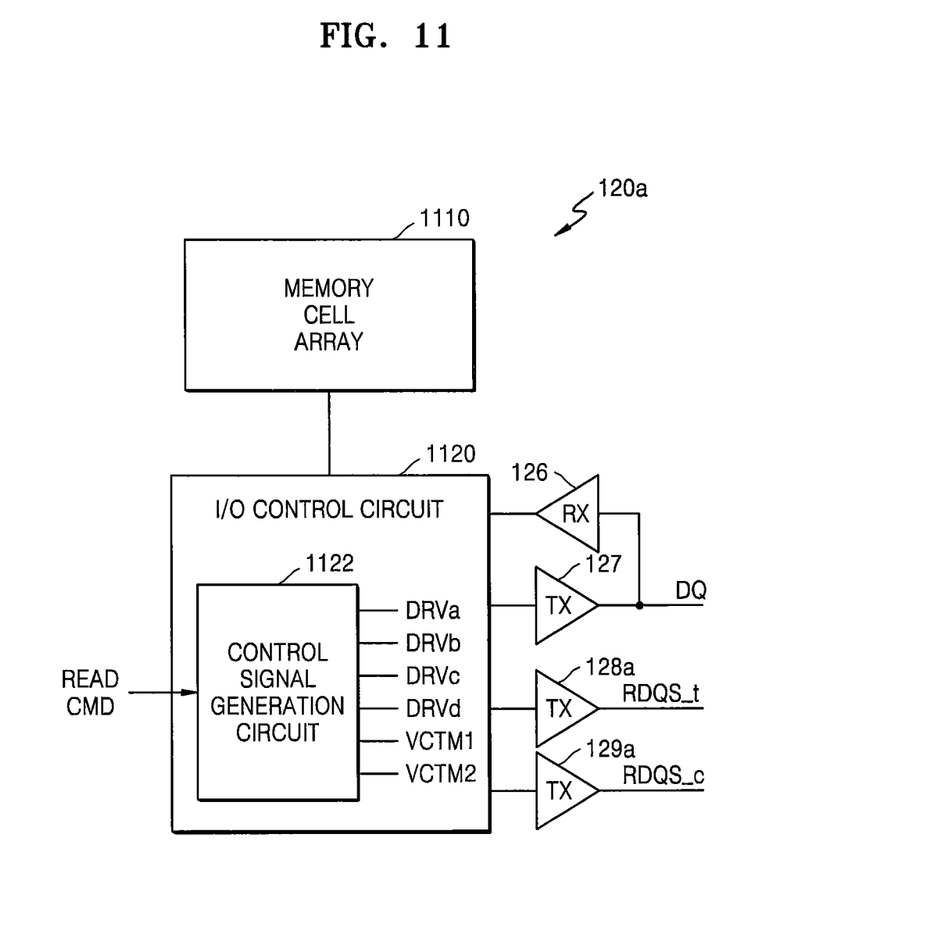
FIG. 11 is a block diagram illustrating a memory device including transmitters according to embodiments of the inventive concept.

FIG. 11 is a block diagram illustrating a memory device including transmitters according to embodiments of the inventive concept.

Referring to FIG. 11, a memory device 120a may be identical to the memory device 120 shown in FIG. 1. The memory device 120a may include a memory cell array 1110, an input/output (I/O) control circuit 1120, a receiver 126, and transmitters 127, 128a, and 129a.

The memory cell array 1110 may include memory cells connected to a plurality of word lines and a plurality of bit lines, and the memory cells may be grouped into a plurality of memory banks and/or a plurality of memory blocks. In the area of the memory cell array 1110, a row decoder, a column decoder, a sense amplifier, and the like for accessing the memory cells may be arranged.

The I/O control circuit 1120 may control a write operation and/or a read operation based on the command CMD and the address ADDR, which are applied to the memory device 120a. In the write operation, the I/O control circuit 1120 may write, to the memory cell array 1110, the write data DQ input via the receiver 126. In the read operation, the I/O control circuit 1120 outputs, via the transmitter 127, the data DQ read from the memory cell array 1110.

The I/O control circuit 1120 may include a control signal generation circuit 1122 generating the first to fourth drive signals DRVa, DRVb, DRVc, and DRVd and the first and second control signals VCTM1 and VCTM2. The control signal generation circuit 1122 may generate the first to fourth drive signals DRVa, DRVb, DRVc, and DRVd and the first and second control signals VCTM1 and VCTM2 based on the read command READ.

The first and second drive signals DRVa and DRVb and the first control signal VCTM1 may be provided to the transmitter 129a. As described with reference to FIGS. 6 and 7, the transmitter 129a may output the complementary read strobe signal RDQS_c in response to the first and second drive signals DRVa and DRVb and the first control signal VCTM1. The transmitter 129a may include: the main output drive circuit 610 outputting the complementary read strobe signal RDQS_c toggled to falling and rising edges thereof, during the read operation in which the read data DQ is output; and the victim output drive circuit 620 outputting the complementary read strobe signal RDQS_c having logic high during a non-read operation. The main output drive circuit 610 may be disabled during the non-read operation, and the victim output drive circuit 620 may be disabled during the read operation.

The third and fourth drive signals DRVc and DRVd and the second control signal VCTM2 may be provided to the transmitter 128a. As described with reference to FIGS. 8 and 9, the transmitter 128a may output the read strobe signal RDQS_t in response to the third and fourth drive signals DRVc and DRVd and the second control signal VCTM2. The transmitter 128a may include: the main output drive circuit 810 outputting the read strobe signal RDQS_t toggled to rising and falling edges thereof, during the read operation in which the read data DQ is output; and the victim output drive circuit 820 outputting the read strobe signal RDQS_t having logic low during the non-read operation. The main output drive circuit 810 may be disabled during the non-read operation, and the victim output drive circuit 820 may be disabled during the read operation.

Figure 12:
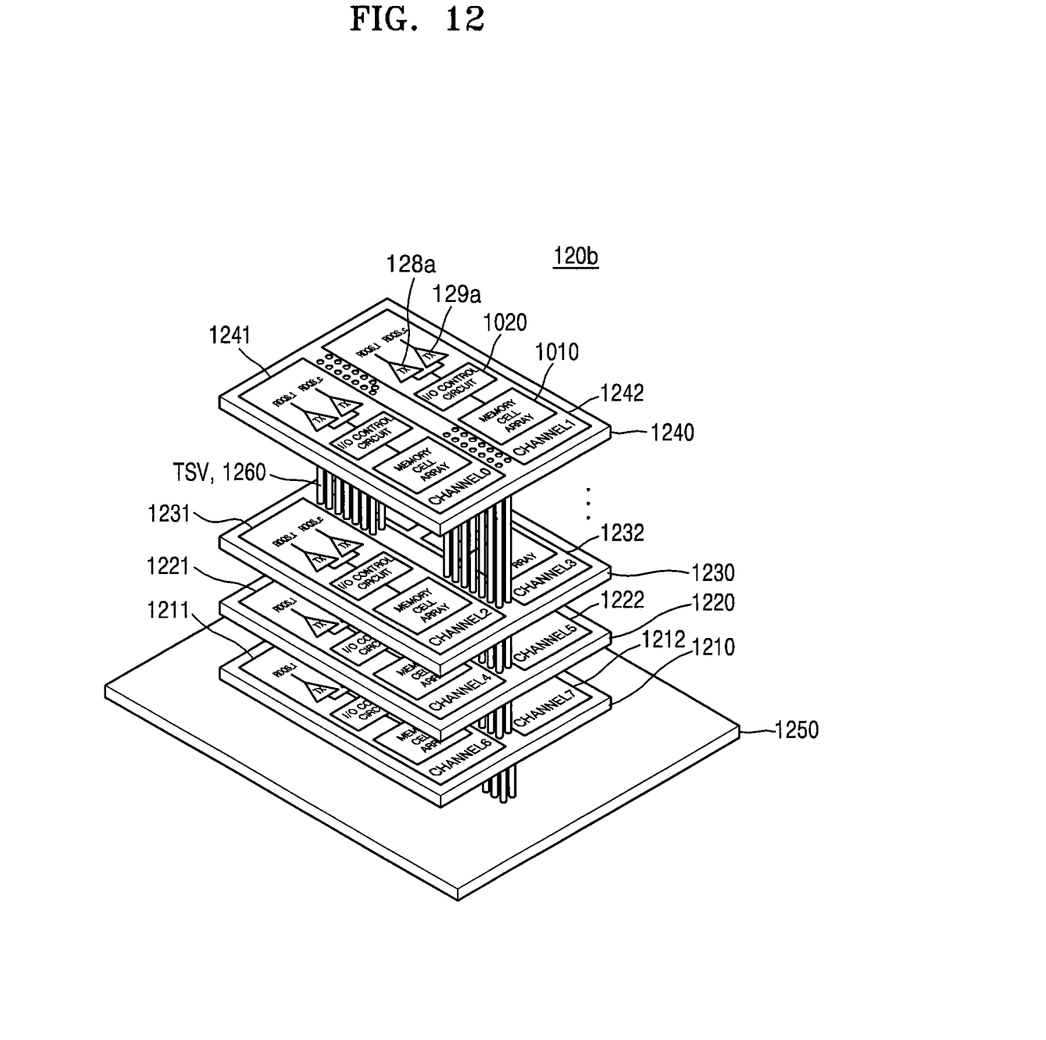
FIG. 12 is a diagram illustrating a memory device including transmitters according to embodiments of the inventive concept.

FIG. 12 is a diagram illustrating a memory device including transmitters according to embodiments of the inventive concept.

Referring to FIG. 12, a memory device 120b includes a plurality of memory layers 1210, 1220, 1230, and 1240 that are stacked. The memory device 120b may be high-bandwidth memory (HBM) providing multi-channel interface-type Wide input/output. The memory layers 1210, 1220, 1230, and 1240 may constitute a plurality of independent interfaces that are referred to as channels. Each of the memory layers 1210, 1220, 1230, and 1240 may include two channels 1211 and 1212, 1221 and 1222, 1231 and 1232, or 1241 and 1242. In the present embodiment, an example, in which the memory device 120b includes eight channels by stacking four memory layers 1210, 1220, 1230, and 1240, is provided. According to an embodiment, two to eight memory layers may be stacked in the memory device 120b.

The memory device 120b may further include a memory buffer 1250 under a lower end of the stacked memory layers 1210, 1220, 1230, and 1240. The memory layers 1210, 1220, 1230, and 1240 may include a through-silicon via (TSV) structure 1260 and may be electrically connected to the memory buffer 1250 via the TSV structure 1260.

The memory buffer 1250 may include an input buffer (or receiver) receiving a command, an address, a clock signal, and data from the memory controller 110 (FIG. 1), and may buffer and provide the received command, address, clock signal, and data to the channels 1211, 1212, 1221, 1222, 1231, 1232, 1241, and 1242. The memory buffer 1250 may provide functions of signal distribution and data input/output for the channels 1211, 1212, 1221, 1222, 1231, 1232, 1241, and 1242 via the TSV structure 1260. The memory buffer 1250 may communicate with the memory controller 110 via conductive means, for example, bumps or solder balls, formed on an outer surface of the memory device 120b.

Each of the channels 1211, 1212, 1221, 1222, 1231, 1232, 1241, and 1242 may include a memory cell array 1010 independently operated for each channel, an I/O control circuit 1020 controlling the memory cell array 1010, and the transmitters 128a and 129a outputting the pair of read strobe signals RDQS_t and RDQS_c.

The transmitter 129a may include: the main output drive circuit 610 outputting the complementary read strobe signal RDQS_c toggled to falling and rising edges thereof, during the read operation in which the read data DQ is output; and the victim output drive circuit 620 outputting the complementary read strobe signal RDQS_c having logic high during the non-read operation. The main output drive circuit

610 may be disabled during the non-read operation, and the victim output drive circuit 620 may be disabled during the read operation.

The transmitter 128*a* may include: the main output drive circuit 810 outputting the read strobe signal RDQS_t toggled to rising and falling edges thereof, during the read operation in which the read data DQ is output; and the victim output drive circuit 820 outputting the read strobe signal RDQS_t having logic low during the non-read operation. The main output drive circuit 810 may be disabled during the non-read operation, and the victim output drive circuit 820 may be disabled during the read operation.

During the non-read operation, the transmitters 129*a* and 128*a* may respectively output the complementary read strobe signal RDQS_c having logic high and the read strobe signal RDQS_t having logic low by enabling the victim output drive circuits 620 and 820 instead of the main output drive circuits 610 and 810. Thus, the PMOS and NMOS transistors of the main output drive circuits 610 and 810 have stable threshold voltages without influences of NBTI and PBTI, whereby the pair of read strobe signals RDQS_t and RDQS_c may be output from the main output drive circuits 810 and 610 in a stable duty ratio during the read operation.

While the inventive concept has been particularly shown and described with reference to embodiments thereof, it will be understood that various changes in form and details may be made therein without departing from the spirit and scope of the following claims.

What is claimed is:

1. An integrated circuit device, comprising:
a read strobe signal transmitter including a main output drive circuit and a victim output drive circuit having an output terminal electrically coupled to an output terminal of the main output drive circuit, said read strobe signal transmitter configured to generate a read strobe signal as: (i) a periodic signal during a read time interval, in response to a pair of periodic drive signals, which are in-phase with each other during the read time interval, and (ii) a disabled read strobe signal at a fixed logic level during a non-read time interval, in response to an active victim control signal.

2. The device of claim 1, wherein the main output drive circuit is responsive to the pair of periodic drive signals during the read time interval; and wherein the victim output drive circuit is responsive to the active victim control signal during the non-read time interval.

3. The device of claim 2, wherein the read strobe signal is generated at the output terminal of the main output drive circuit during the read time interval and at the output terminal of the victim output drive circuit during the non-read time interval.

4. The device of claim 3, wherein the output terminal of the main output drive circuit is electrically shorted to the output terminal of the victim output drive circuit.

5. The device of claim 4, wherein the victim output drive circuit comprises a MOS transistor having a gate terminal responsive to the active victim control signal during the non-read time interval.

6. The device of claim 4, wherein the victim output drive circuit comprises a MOS transistor having a gate terminal responsive to the active victim control signal during the non-read time interval; and wherein the output terminal of the victim output drive circuit is the drain terminal of the MOS transistor.

7. The device of claim 6, wherein the MOS transistor is selected from a group consisting of a PMOS pull-up transistor and an NMOS pull-down transistor.

8. The device of claim 2, wherein the main output drive circuit comprises a PMOS pull-up transistor having a gate terminal responsive to a first one of the pair of periodic drive signals and an NMOS pull-down transistor having a gate terminal responsive to a second one of the pair of periodic drive signals.

9. The device of claim 5, wherein the victim output drive circuit is disabled and the MOS transistor is disposed in a non-conductive state during the read time interval.

10. The device of claim 6, wherein the victim output drive circuit is disabled and the MOS transistor is disposed in a non-conductive state during the read time interval.

11. An integrated circuit device, comprising:
a read strobe signal transmitter including a main output drive circuit and a victim output drive circuit, which has an output terminal electrically coupled to an output terminal of the main output drive circuit and is responsive to a victim control signal, said read strobe signal transmitter configured to generate a read strobe signal as: (i) a periodic signal during a read time interval when the victim control signal is inactive, and (ii) a disabled signal at a fixed logic level during a non-read time interval when the victim control signal is active.

12. The device of claim 11, wherein the main output drive circuit is disabled when the victim control signal is active.

13. The device of claim 11, wherein the victim output drive circuit is disabled when the victim control signal is inactive.

14. The device of claim 11, wherein the main output drive circuit comprises: a PMOS pull-up transistor having a drain terminal electrically connected to the output terminal of the main output drive circuit; and an NMOS pull-down transistor having a drain terminal electrically connected to the output terminal of the main output drive circuit.

15. The device of claim 14, wherein the main output drive circuit is responsive to a pair of periodic drive signals during the read time interval.

16. The device of claim 14, wherein the victim output drive circuit comprises a MOS transistor having a drain terminal electrically coupled to the output terminal of the main output drive circuit.

17. The device of claim 15, wherein the pair of periodic drive signals are in-phase with each other during the read time interval.

18. The device of claim 15, wherein the main output drive circuit is responsive to a pair of drive signals during the non-read time interval; wherein the pair of drive signals includes a first drive signal that is held at a first logic level during the non-read time interval and a second drive signal that is held at a second logic level during the non-read time interval; and wherein the first and second logic levels are opposite logic levels.

\* \* \* \* \*